United States Patent [19]
Deligi et al.

[11] Patent Number: 5,377,816
[45] Date of Patent: Jan. 3, 1995

[54] SPIRAL MAGNETIC LINEAR TRANSLATING MECHANISM

[75] Inventors: Mario Deligi, Newton, N.J.; Senia Derbinsky, River Edge, N.Y.

[73] Assignee: Materials Research Corp., Orangeburg, N.Y.

[21] Appl. No.: 92,004

[22] Filed: Jul. 15, 1993

[51] Int. Cl.6 .............................................. B65G 35/00
[52] U.S. Cl. .................................... 198/619; 414/217
[58] Field of Search ................ 414/217, 218; 198/619, 198/690.1, 657, 676; 118/657, 658; 204/298.01, 298.23

[56] References Cited

U.S. PATENT DOCUMENTS

| | | | |
|---|---|---|---|
| 3,731,166 | 5/1973 | Inuzuka et al. | 318/35 |
| 3,754,313 | 8/1973 | McCulloch | 198/619 X |
| 3,759,367 | 9/1973 | Elliott | 198/619 |
| 4,170,287 | 10/1979 | Edwards et al. | 198/657 |
| 4,197,934 | 4/1980 | Matsui et al. | 198/690.1 |
| 4,518,078 | 5/1985 | Garrett | 198/775 |
| 4,540,326 | 9/1985 | Southworth et al. | 414/217 |
| 4,619,573 | 10/1986 | Rathmann et al. | 414/222 |
| 4,624,617 | 11/1986 | Belna | 198/619 X |
| 4,664,578 | 5/1987 | Kakehi | 414/217 |
| 4,793,263 | 12/1988 | Basic et al. | 104/282 |
| 4,805,761 | 2/1989 | Totsch | 198/619 |
| 4,812,101 | 3/1989 | George et al. | 414/220 |
| 4,818,378 | 4/1989 | Elliott | 209/225 |
| 4,877,123 | 10/1989 | Fukuwatari et al. | 198/619 |
| 4,900,962 | 2/1990 | Hockney et al. | 310/90.5 |
| 4,917,556 | 4/1990 | Stark et al. | 414/217 |
| 4,941,429 | 7/1990 | Wilkinson et al. | 118/715 |
| 4,953,470 | 9/1990 | Yamaguchi | 104/282 |
| 4,981,408 | 1/1991 | Hughes et al. | 414/217 |
| 5,062,758 | 11/1991 | Trillwood | 414/217 |
| 5,088,593 | 2/1992 | Lewin | 198/619 |
| 5,110,248 | 5/1992 | Asano et al. | 414/172 |
| 5,110,249 | 5/1992 | Norman | 414/217 |
| 5,127,337 | 7/1992 | Beattie et al. | 104/294 |
| 5,163,546 | 11/1992 | Kawada et al. | 198/619 |
| 5,170,891 | 12/1992 | Barrett | 209/223.2 |
| 5,284,411 | 2/1994 | Enomoto et al. | 198/619 X |

FOREIGN PATENT DOCUMENTS

| | | | |
|---|---|---|---|
| 0955869 | 10/1974 | Canada | 198/619 |
| 0052149 | 3/1982 | Japan | 198/619 |
| 0217857 | 9/1982 | Japan | 198/619 |
| 0045823 | 3/1986 | Japan | 198/619 |
| 0333422 | 11/1992 | Japan | 198/619 |

*Primary Examiner*—James R. Bidwell
*Attorney, Agent, or Firm*—Wood, Herron & Evans

[57] ABSTRACT

A spiral magnetic linear translating mechanism for use with a wafer processing system which includes a plurality of evacuatable housings connected in a series to form a processing line comprises at least one wafer support structure which is mounted to move on a track through the housings along the processing line. The structure includes a base disposed proximate a wall of the housing and includes a plurality of magnetic thread segments extending thereon to face the wall. Outside of the housing, a cylindrical shaft is mounted proximate the wall. An elongated magnetic drive with successive sections is wound spirally around the shaft to rotate with the shaft so that the sections of the drive face the wall opposite the thread segments. The magnetic thread segments are attracted to the magnetic drive, thus coupling the wafer support structure to the shaft such that when the shaft rotates the thread segments are exposed to different successive sections of the drive located further along the shaft and the wafer carrier is driven linearly along the track and through the housing. Preferably, the magnetic thread segments and spiral magnetic drive are made up of individual magnetic elements alternately magnetically polarized at their outer extremities with opposite magnetic polarities so that the individual thread segment elements are attracted to drive elements having opposite magnetic polarities. In an alternative embodiment, the shaft includes a plurality of magnetic drives wound spirally thereon. The shaft is covered with a non-magnetic sleeve to protect the magnetic drive.

37 Claims, 5 Drawing Sheets

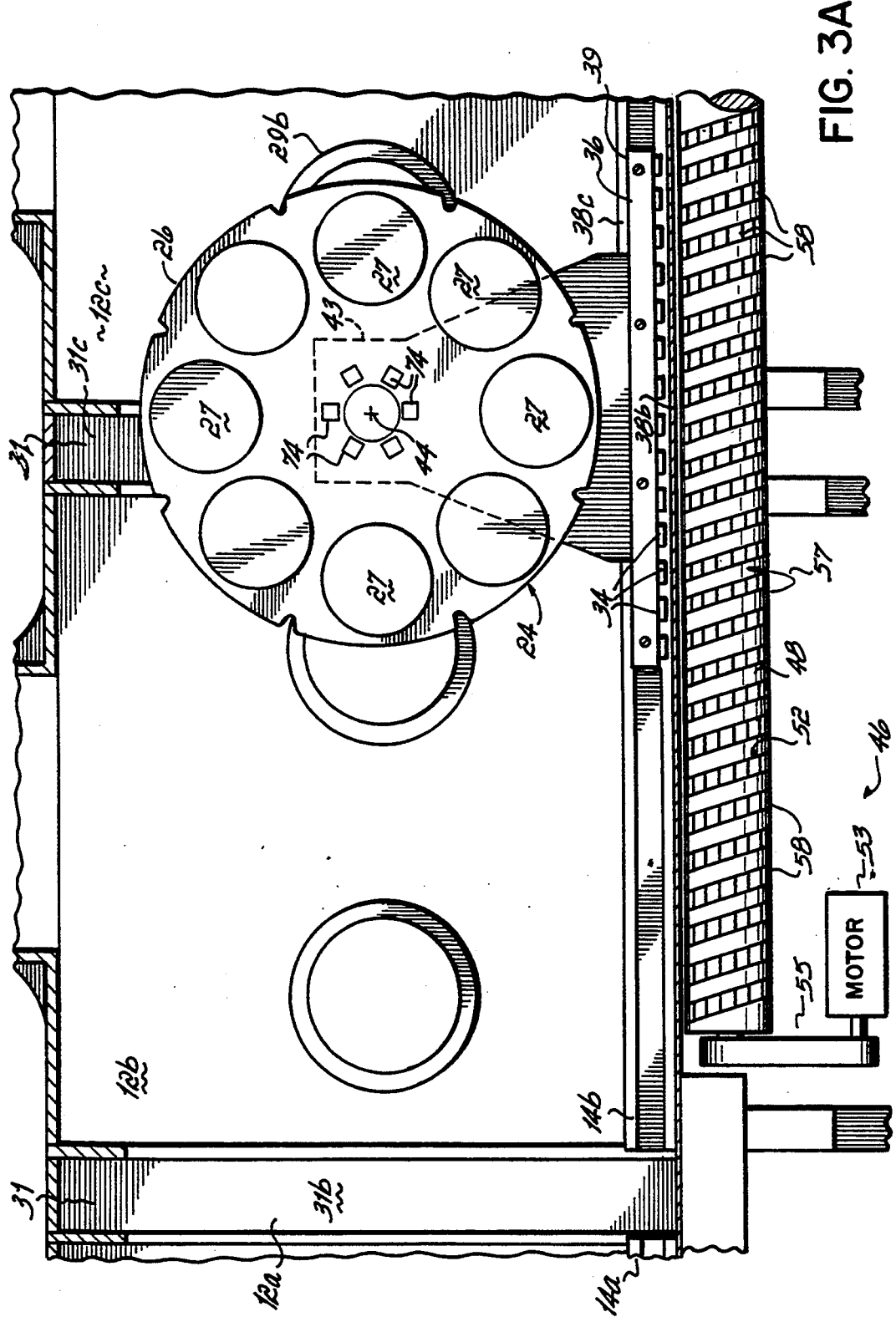

SPIRAL MAGNETIC LINEAR TRANSLATING MECHANISM

RELATED APPLICATIONS

This application is related to U.S. application, Ser. No. 07/905,016 filed Jun. 26, 1992 and entitled Transport System for Wafer Processing Line, which application is incorporated herein by reference.

FIELD OF THE INVENTION

This invention relates to a linear translating mechanism for a wafer processing line. More particularly, this invention relates to a translating mechanism which includes one or more magnetic linear drive units for translating a wafer carrier along a wafer processing line.

BACKGROUND OF THE INVENTION

Semiconductor wafer manufacture generally requires the performance of a plurality of processing steps according to a predetermined sequence under vacuum conditions. In one type of wafer processing system, evacuatable modules or housings connect serially, and each housing serves as the site for performing one of the processing steps, such as heating or sputter coating, or simply to initially isolate wafers from the outside environment. Wafer processing systems which utilize a plurality of serially-connected housings are commonly referred to as "in-line" processing systems. Generally, these "in-line" systems allow maximum wafer throughput and processing per unit time.

For in-line wafer processing systems where processes such as sputter deposition, vacuum evaporation, and plasma etching are performed, it is necessary to translate substrate wafer holders or pallets within the vacuum processing system to move wafers through each housing. Motion of these parts inside the vacuum is usually accomplished by using vacuum feed-throughs of various kinds. A feed-through, such as a shaft, penetrates the walls of the vacuum processing system to provide a physical connection between the atmospheric side and the vacuum side. These vacuum feed-through connections generally have seals which prevent leaks from the atmosphere into the vacuum.

Usually a rotary feed-through device is used to transmit rotational motion into the vacuum processing chamber. The rotational motion is then converted to linear motion within the vacuum chamber by means of mechanical coupling components such as a ball screw, rack and pinion, worm gear, nuts, etc. which depend on friction to operate. However, in many processing applications the cleanliness of the vacuum process system is critical. Mechanical devices which depend upon frictional forces to provide linear motion unfortunately generate particles, and hence, contamination. This, therefore, makes these devices unsuitable for applications where extreme cleanliness and particulate free operation is required in the vacuum processing chamber.

It has been proposed to use linear magnetic drives to transport wafers through various processing chambers or stations which drives utilize a continuous belt or track mounted on rotating rollers externally of the vacuum chamber. The belt includes spaced magnetic elements which move linearly as the belt rotates. A cart or wafer-carrying vehicle may be located internally of the vacuum chamber to move the wafers through the in-line processing system and the bottom surface of the cart includes magnetic elements mounted thereon. When the belt rotates, the belt magnetic elements are magnetically coupled to the cart magnetic elements, and the wafer cart follows the motion of the belt and moves linearly through successive processing stations. A problem with such transporting mechanisms, however, is that they are very complex and involve a number of moving parts which constantly require replacement or adjustment. The maintenance, in turn, is both difficult and time-consuming. Furthermore, in drive systems which utilize a continuous belt or track, the belt has a tendency to stretch after use, thus necessitating further adjustments to make sure that the belt and the cart remain magnetically coupled.

It is, therefore, an objective of the present invention to transport wafers along a wafer processing line under vacuum conditions with a minimum risk of contamination from particulates generated inside the processing chamber.

It is another objective of this invention to maximize wafer throughput for an in-line processing system and to minimize wafer handling which presents a further risk of contamination.

It is still a further objective of the present invention to transport wafers using a device which has a minimum of parts to replace or adjust, thus making the device simple and inexpensive to maintain and operate.

SUMMARY OF THE INVENTION

This invention meets the above-stated objectives by utilizing a novel spiral magnetic coupling between drive units located outside a wafer processing line and wafer carriers located inside the processing line to drive the carriers on a track through serially connected, evacuatable housings.

The spiral magnetic linear translating mechanism of the present invention includes a wafer carrier with wheels which roll along a track extended between the serially connected housings. The track defines a path through the housings. The wafer carrier has a plurality of linear magnetic thread segments positioned thereon in a plane substantially parallel with the plane of the track. The magnetic thread segments each include several oppositely polarized magnetic elements which are situated side-by-side to form the thread segment. The thread segments are preferably arranged so as to be proximate the side or bottom wall of the housing when the carrier is mounted on the track. On the opposite side of the appropriate wall, such as the bottom wall, and proximate the wall, there is located an elongated cylindrical shaft which rotates on its longitudinal axis on an axle which is situated linearly beneath the housing and extends generally parallel with the track. Affixed to the shaft is an elongated magnetic drive comprising successive sections which is wound spirally around substantially the entire length of the shaft. The spirally-wound drive maintains a generally equal lead angle along its length so that all of the sections located on a side of the shaft extend substantially parallel with each other. The sections of the magnetic drive on the side of the shaft facing the chamber wall that extend proximate the bottom wall are magnetically coupled to the magnetic thread segments which are also proximate the housing bottom wall. Rotating the shaft exposes different successive magnetic sections of the drive to the thread segments, and the different sections are located further along the length of the shaft. Rotating the shaft moves the carrier generally parallel to the shaft and on the path through the serial housings. The magnetic coupling between the magnetic thread segments and the sections of the magnetic drive is such that the carrier moves along the track when the shaft is rotated much the same way a nut moves on a threaded bolt when the bolt is rotated.

In a preferred embodiment of the present invention, the magnetic drive is comprised of individual magnetic elements which are placed side by side with each other to form a generally continuous drive. Each drive element has an opposite magnetic polarity at its outer extremity to its adjacent magnetic drive elements. The magnetic drive elements making up the spiral magnetic drive establish a plurality of magnetic fields in the housing. As the shaft rotates, the spiral magnetic drive acts analogous to the thread of a screw and the imposed magnetic fields inside the housing move in a linear direction generally parallel to the longitudinal axis of the cylindrical shaft and parallel the carrier track. Because of the spiral winding of the magnetic drive around the shaft, the sections of the drive which are adjacent to the bottom wall and the thread segments of the carrier maintain an angled disposition or "lead angle" with respect to the longitudinal rotational axis of the shaft. The magnetic thread segments of the wafer carrier act analogous to the threads of a nut and are also angled with respect to the shaft axis to extend generally parallel to the drive sections. In fact, when the carrier is magnetically coupled with the spiral drive, the thread segments will generally overlie adjacent sections of the drive. In this way, there is an efficient magnetic coupling between the moving, established magnetic field of the spiral drive and the magnetic thread segments of the carrier to cause the carrier to translate linearly through the housing along the track when the shaft rotates. Similar to the spiral drive, the thread segments of the carrier comprise a plurality of magnetic elements of alternating opposite polarities at their outer extremities. In this way a north polarized magnetic element of the drive is attracted to a south polarized thread segment element and vice versa. In another embodiment of the present invention, the spiral magnetic drive might be completely of one polarity, while the thread segments are of an opposite polarity.

A plurality of spiral magnetic linear translating mechanisms of the present invention may be used in a wafer processing line including successive housings and wafer processing stations. With a plurality of spiral magnetic translating mechanisms or drive units, a magnetic drive unit is associated with each evacuatable housing which forms one processing station along a wafer processing line defined by the plurality of serially connected housings. A track extends through the interconnected housings. At least one wafer carrier is movable along the track and holds magnetic thread segments arranged in a plane substantially parallel with the plane of track and proximate to a nonmagnetic wall of the housings. The wafer processing devices for use with the translating mechanism of the present invention are mounted within, or integrally formed with the successive housings, so that each housing defines a wafer processing station along the processing line. Operations which may be performed at the stations include sputter deposition, sputter etching, heating, degassing, chemical vapor deposition, plasma assisted chemical vapor deposition or any other wafer processing step necessary to manufacture of semiconductor wafers. Depending upon the necessary processing steps, wafer processing lines may include as two as two serially connected housings, or up to ten or more serially connected housings.

Each individual shaft may be rotated by a motor, which is coupled to the shaft axle by a gear train. The successive drive units move the wafer carrier along the track through the individual processing stations. The length of the carrier is dimensioned so that when the carrier passes between successive housings, the spiral magnetic drive unit of the former housing drives the back end of the carrier forward while the spiral magnetic drive unit of the next successive housing magnetically engages the front end of the carrier to continue its forward linear translation through the successive processing station. Alternatively, one shaft may extend under all of the housings to move the carrier through the wafer processing lines.

While one embodiment of the present invention utilizes a rotating magnetic shaft having one spiral magnetic drive extending around the shaft, alternative embodiments utilize a plurality of magnetic drives wrapped spirally around the same shaft to interleave with one another. Preferably, each magnetic drive of the plurality originates its spiral path around the shaft at a point on the periphery of the shaft end which is equidistant from the origination points of the other adjacent spiral drives. The multiple spiral drives also preferably maintain equal lead angles with respect to the longitudinal shaft axis and each other so that they do not intersect. A plurality of drives results in spiral sections having closer spacing so as to produce a smoother translation of the wafer carrier along the track as the shaft rotates. Another embodiment might decrease the lead angle of a single spiral drive to decrease spacing between adjacent drive sections and provide a smoother translation of the wafer barrier.

Compared to prior wafer translating mechanisms, this wafer translating mechanism is simple, clean and results in reduced particulate generation from frictional mechanical components. For example, silicone wafer processing equipment for LSI and VLSI applications requires a cleanliness level of less than 0.01 to 0.30 micrometers or larger size particles per $cm^2$ of substrate surface. In such an application, a sputtering system is used for aluminum metallization. Because this process is particularly sensitive to particles generated from frictional forces, the system used cannot employ internal mechanical components which generate particles due to frictional forces. However, the present invention is very suitable to such an application.

Another advantage of this invention relates to its ease of maintenance. All of the major drive components associated with the translating mechanism are located outside of the vacuum processing housings and can be easily reached for service, repair or replacement without breaking the vacuum or requiring entry into any of the separate processing stations or housings. Furthermore, with a minimum amount of moving parts, and the absence of a belt or track which may stretch length as it is used, the present invention does not require constant maintenance or adjustment. Even when maintenance or adjustment is required, it will generally be simple, quick and accurate. This increases the up time of the equipment and decreases the time associated with service, repair and replacement. The net result is an overall increase in productivity for the wafer processing line.

These and other features of the invention will be more readily understood in view of the following detailed description and the drawings.

BRIEF DESCRIPTION OF DRAWINGS

FIG. 3A is a cross-sectional side view showing an alternative embodiment of the spiral magnetic lines translating mechanism of the present invention.

DETAILED DESCRIPTION OF THE DRAWINGS

Figure 1:
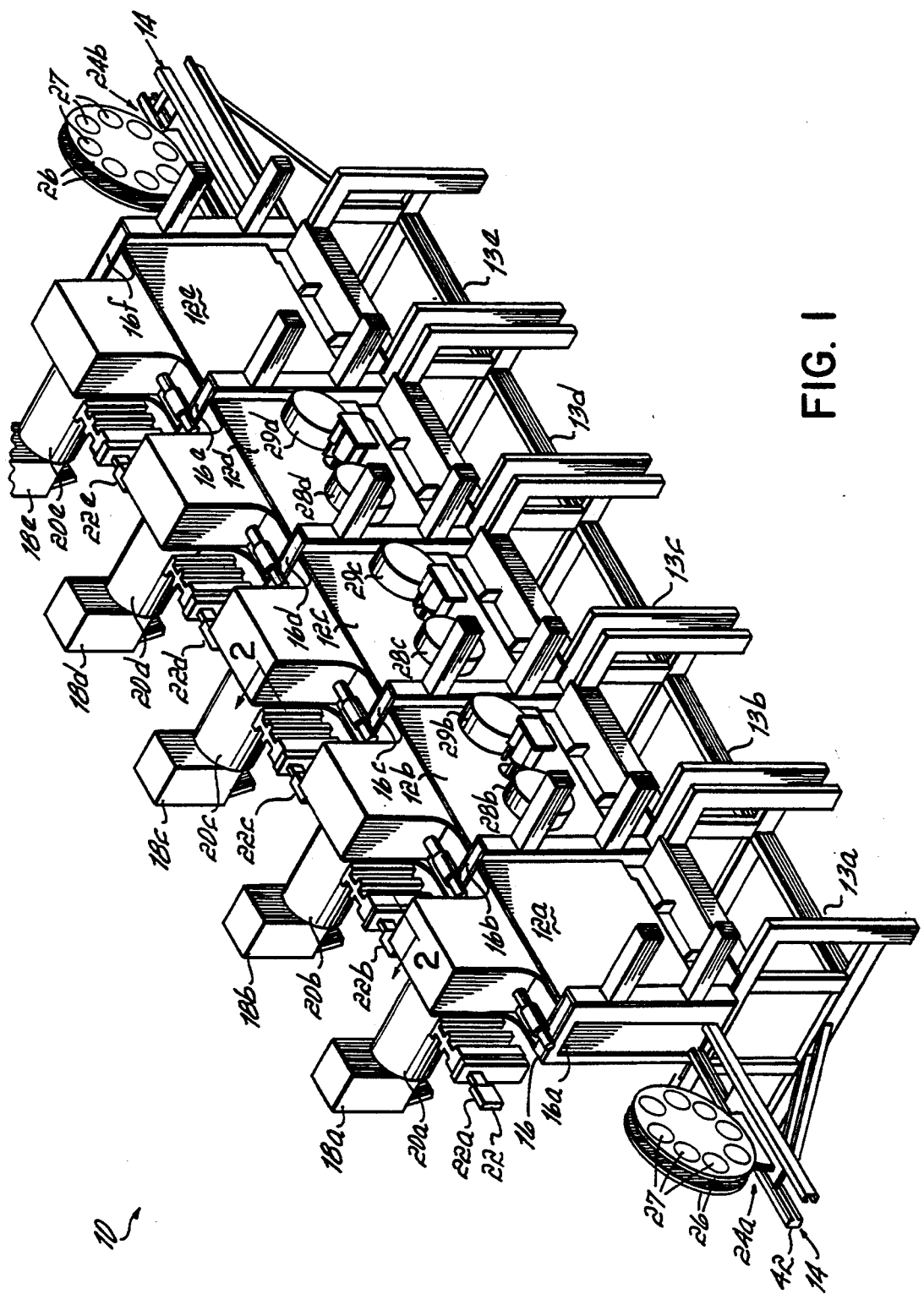
FIG. 1 is a perspective view of a wafer processing line which utilizes the spiral magnetic linear translating mechanism of the present invention.

FIG. 1 shows a wafer processing system 10 using the wafer translating mechanism of the present invention. The processing system 10 includes a plurality of vacuum housings 12a, 12b, 12c, 12d and 12e which are serially connected. The housings 12a–12e are supported on rigid frames 13a–13e, respectively. A track 14 extends along and through the serially connected housings 12a–12e. Though not shown in FIG. 1, the track 14 comprises a plurality of track segments 14a, 14b, 14c, 14d and 14e which correspond to housings 12a, 12b, 12c 12d and 12e, respectively.

Isolation valves 16 separate and isolate each of the adjacently situated vacuum housings 12. The isolation valves 16 open and close to permit and restrict, respectively, access between adjacently situated housings 12 along the track 14. In FIG. 1, isolation valve 16b is located between housings 12a and 12b. Similarly, isolation valve 16c is located between housings 12b and 12c. While FIG. 1 shows six isolation valves, designated by reference numerals 16a–16f, with one isolation valve 16 between every two adjacently situated housings 12, it is to be understood that one or more of these isolation valves 16 could be omitted at the entry and exit ends of any one or more of the housings 12, depending upon the vacuum conditions required for wafer processing. It is further understood that additional housings 12 may be connected in series. The total number of housings 12 will depend upon particular series of wafer processes that are being performed on the wafer. The spiral linear magnetic translating mechanism of this invention is advantageous with respect to a wafer processing line which includes as few as one housing 12 and up to twelve or more successive housings 12.

Preferably, each of the housings is evacuatable. FIG. 1 shows vacuum pumps 18a–18e connected to housings 12a–12e via conduits 20a–20e, respectively. The vacuum pumps 18a–18e may be isolated from the housings 12a–12e by gate valves 22a–22e, respectively.

At least one wafer carrier 24 is linearly translatable along the track 14 through the successive housings 12 when the isolation valves 16 are open. FIG. 1 shows a carrier 24a located adjacent the entrance to housing 12a and a second carrier 24b located adjacent the exit of housing 12e. Each wafer carrier 24 includes a pair of spaced, parallel and vertically oriented support members, or pallets 26. The pallets 26 support wafers 27 during wafer processing along the track 14. Preferably, to maximize throughput for a wafer processing operation, a plurality of carriers 24 are synchronously translated in linear fashion through the housings 12 along the track 14. The pressure in each housing 12 is controlled by its corresponding vacuum pump 18, gate value 22 and the two isolation valves 16 located at opposite ends thereof.

In each of the housings 12, a particular wafer processing step is performed. FIG. 1 shows wafer processing units 28b and 29b mounted to one side of housing 12b. Similarly, wafer processing units 28c and 29c are mounted to one side of housing 12c, and wafer processing units 28d and 29c are mounted to one side of housing 12d. These wafer processing units 28 and 29 may be adapted for performing cathode sputtering, sputter etching, heating or any one of a number of other wafer processing steps.

Figure 2:
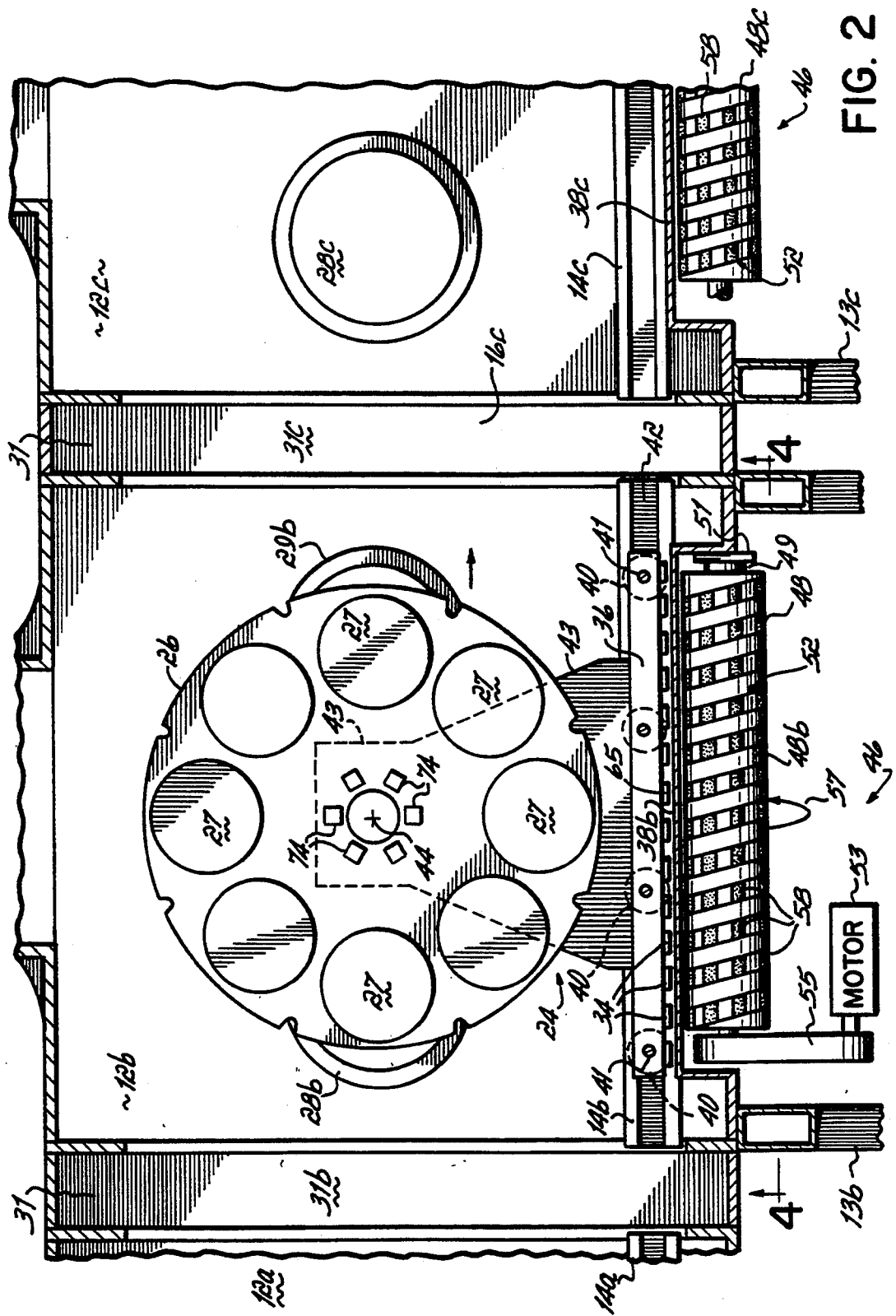
FIG. 2 is a cross-sectional side view taken along lines 2—2 of FIG. 1.

FIG. 2 shows a cross sectional side view of serially connected housings 12b and 12c. Track segments 14b and 14c are located within the housings 12b and 12c, respectively. A space 31 is located between each of the housings 12. More specifically, 31c space is located between interconnected housings 12b and 12c. This space 31c is occupied by isolation valve 16c when the valve 16c is closed to isolate the housings 12b and 12c from each other. The cross sectional dimensions of this space 31c are slightly greater than the cross sectional dimensions of the wafer carrier 24. When the isolation valve 16c is open, the space 31c is empty and the carrier 24 may move through space 31c along the track 14 from housing 12b to housing 12c.

To move the wafer carrier 24 through housing 12b, through space 31c and into housing 12c, and along the track 14 between the other interconnected housings 12, the carrier 24 includes a base 36 which is equipped with a plurality of magnetic thread segments 34. The magnetic thread segments 34 are situated to extend in a plane substantially parallel to the plane of track segment 14b and are mounted at the bottom of base 36 of the wafer carrier 24 for translating the carrier 24 along track 14b as described hereinbelow. Each of the thread segments 34 is skewed at an angle Φ from the longitudinal axis 47 of the base 36 and extends generally parallel to the adjacent thread segments (See FIG. 4). The thread segments 34 are equally spaced apart from each other a distance "d'." The opposite ends of the thread segments 34 are in longitudinal alignment along imaginary lines A and B which are generally parallel to the longitudinal axis 47 of the base 36 on opposite sides thereof and equidistant therefrom. The base 36 is supported by tracks 14b above a nonmagnetic bottom wall 38b of housing 12b by wheels (not shown) located on opposite sides of the carrier 24. The wheels rotate on axles 41 which extend outwardly frown opposite sides of the base 36, and they ride on the bottom surfaces of the C-shaped channels 42 which make up track 14 (see FIG. 1). The tops of the channels 42 are spaced above the tops of the wheels. Preferably, four equidistantly spaced pairs of wheels are provided for each carrier 24 with a pair on each axle 41, though three pairs or even five pairs or more would also be suitable.

To linearly translate the carrier 24 along the track 14, a plurality of spiral magnetic linear translating mechanisms 46 of the present invention are utilized, with one translating mechanism 46 being provided for operation in connection with each of the housings 12. Referring to FIG. 2, the translating mechanism 46 includes a drive unit which comprises a cylindrical shaft 48 mounted to rotate about its longitudinal axis on axle 49 which extends beneath housing 12b essentially parallel to the longitudinal axis 47 of the base 36 of the wafer carrier 24 and generally parallel to track 14b; an elongated magnetic drive 52 which is spirally wrapped around cylindrical shaft 48 from one end of the shaft to the other end; and an associated motor 53 and gear train 55 to rotate the shaft about axle 49. A bearing 51 may also be used to allow a smooth rotation of shaft 48.

Figure 4:
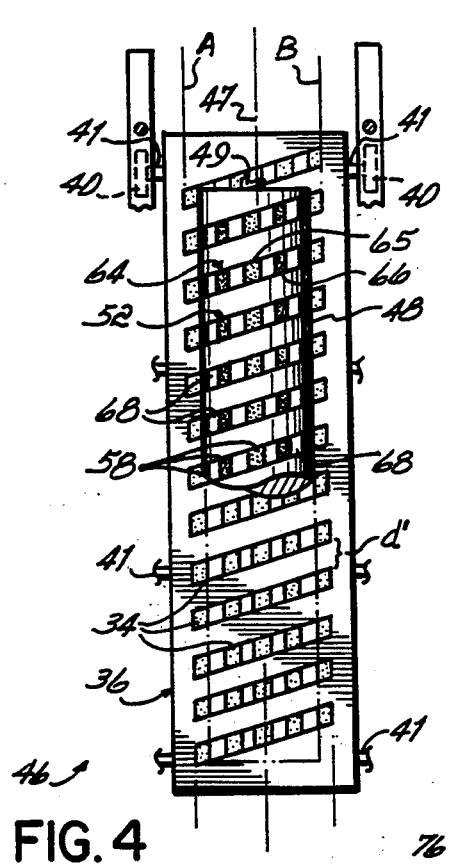
FIG. 4 is a partial cross-section along lines 4—4 of FIG. 1 to show alignment of the carrier thread elements of the spiral magnetic drive of the present invention.

The elongated magnetic drive 52 which is spirally wound around shaft 48 gives shaft 48 the appearance of a conventional mechanical screw or threaded bolt. The shaft is preferably made of a steel material such as cold-rolled steel. The individual sections of drive 52, such as section 59 form an angle $\phi$ with the axle 49 of the shaft 48. This angle $\phi$ or "lead" angle is determined by how tightly the spiral drive 52 is wound around shaft 48. A coarse spiral, where adjacent drive sections 59 are further apart, corresponds to an increased lead angle. The magnetic drive 52 establishes magnetic fields inside housing 12b through non-magnetic wall 38b. When a wafer carrier 24 is located on track 14b in the housing, the magnetic fields imposed by the drive act in proximity to base 36 of carrier 24. The magnetic thread segments 34 disposed along the bottom of the base 36 extend at an angle $\phi$ with respect to the longitudinal axis of base 36 (see FIG. 4). Magnetic thread segments 34 are angled such that when they overlie the sections of the spirally wound magnetic drive 52 which face the bottom wall 38b of housing 12b and the base 36, they extend essentially parallel to the drive sections and are spaced from and vertically aligned with the sections as is shown in FIG. 4. That is, each thread segment 34 extends essentially parallel to the associated angled section of drive 52 which it overlies when the carrier overlies shaft 48. The magnetic fields established proximate base 36 within housing 12b by the sections of spiral drive 52 magnetically couple the magnetic thread segments 34 of base 36 and the wafer carrier 24 to the magnetic drive 52. The spiral magnetic drive 52 and the magnetic thread segments 34 are magnetically polarized to be attracted to each other. When shaft 48 is driven to rotate about axle 49 in a direction signified by arrow 57, each particular thread segment 34 will be exposed to constantly varying sections of the spiral drive 52. That is, different sections of drive 52 face the bottom wall 38 at any given time when shaft 48 rotates. As may be appreciated, each successive different drive section, which is attracted by a particular thread segment 34, is disposed further along the length of shaft 48 as the shaft 48 rotates according to arrow 57. The section which underlies and is coupled to a particular thread segment 34 essentially "travels" along the length of shaft 48 during its rotation. Although the spiral drive 52 does not actually move along the shaft the induced magnetic fields essentially move from one end of the shaft to the other as the shaft rotates. This is similar to following the thread of a screw from the tip to the screw head as the screw rotates. Since the thread segments are attracted to the sections of the spiral magnetic drive 52 which are adjacent the bottom wall 38b because of the induced magnetic fields, the thread segments 34 are also driven in a linear direction along shaft 48, and the wafer carrier 24 translates the wafers through the housings 12 much the same way as a nut moves along a threaded bolt when it is rotated.

Figure 3:
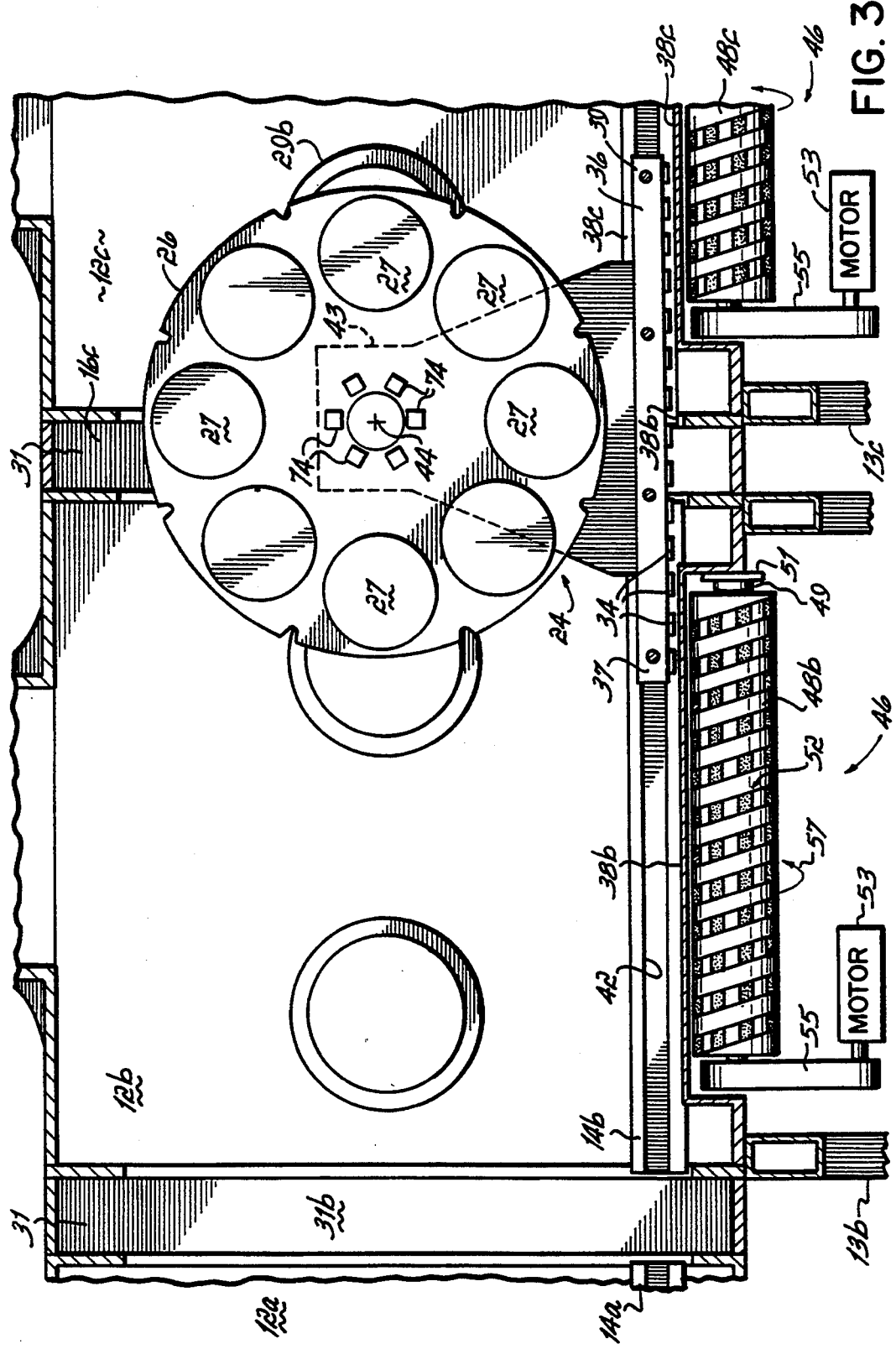
FIG. 3 is a cross-sectional side view similar to FIG. 2 showing a wafer carrier moving between successive processing housings.

The base 36 of the wafer carrier 24 is preferably dimensioned in length to accommodate a sufficient number of thread segments 34 to couple with several if not all of the sections of spiral magnetic drive 52 which are adjacent bottom housing wall 38b at any given time. That is, the number of turns of the magnetic drive 52 per unit length of the shaft 48 is preferably approximately the same as the number of thread segments 34 per unit length of the base 36. A one-to-one ratio between the sections of drive 52 and the thread segments 34 increases the magnetic coupling between the base 36 and shaft 48 thereby making for a smoother linear translation of the wafer carrier 24. However, in an alternative embodiment of the present invention, base 36 may have a length that is shorter or longer than shaft 48 or may only have one thread segment which is disposed adjacent a section of the spiral drive 52. As shown in FIG. 3, base 36 preferably has a length which allows it to overlie the cylindrical shafts 48b and 48c of successive housings. In this way, when the carrier 24 passes between successive housings 12b and 12c, the spiral magnetic drive 52b of shaft 48b pushes the back end 37 of a carrier base 36 while the spiral magnetic drive 52c of shaft 48c magnetically engages the front end 39 of the carrier base 36 to continue its linear translation through the successive processing housings. In this way, wafer carrier 24 may be translated completely through the entire processing line and each successive housing 12 without the need to manually move carrier 24 to engage each successive spiral magnetic drive 52.

In another embodiment of the present invention as shown in FIG. 3A, the shaft 49 is dimensioned in length to extend beneath several housings and may be of such a length as to extend beneath all of the housings. In this way, the wafers are moved through the entire wafer processing system by the same shaft 49 and the same magnetic drive 55.

Figure 6:
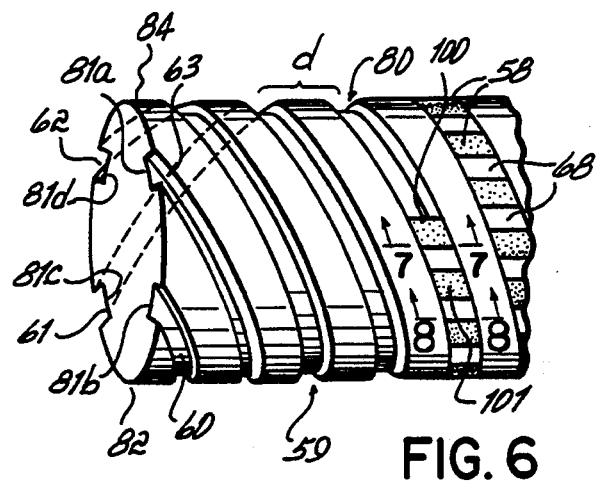
FIG. 6 is a perspective view of an alternative embodiment of the drive shaft utilized in the present invention.
Figure 5:
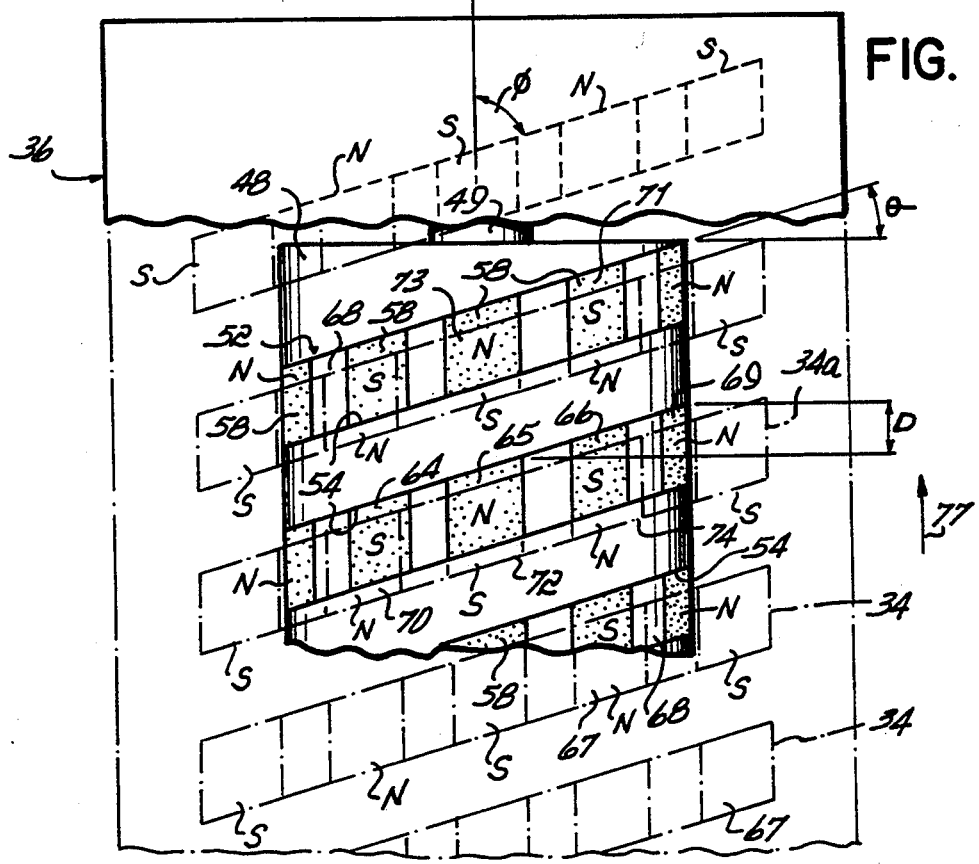
FIG. 5 is an enlarged cross-sectional view along lines 5—5 of FIG. 4.

Preferably, the shaft 48 is made of cold rolled steel and has one or more spiral grooves such as grooves 60, 61, 62 and 63 shown on shaft 59 of FIG. 6, cut therein to receive one or more spiral magnetic drives 52. The embodiment of the present invention disclosed in FIGS. 1–5 show the shaft 48 having only one drive element 52; however, other drive elements may be added as shown in FIG. 6 and described hereinbelow. FIGS. 4 and 5 illustrates a preferred embodiment of spiral magnetic drive 52, wherein a spiral groove 54 is cut in shaft 48 and pockets or recesses (not shown) are formed in the groove 54 and are shaped and dimensioned to receive a plurality of magnetic elements 58. The magnetic elements 58 (shown as generally rectangular elements) are situated so that their outer sides which face the thread segments have alternating opposite magnetic polarities as one moves along drive 52 down the length of shaft 48. That is, magnetic element 65 is polarized magnetically north at its outer end and south at its inner end while adjacent elements 64 and 66 are polarized magnetically south at their outer ends and north at their inner ends. Because the shaft 48 is made of a ferromagnetic material, such as cold rolled steel, the individual magnetic elements 58 are held within the recesses by their magnetic attraction to the steel shaft 48. In this way, no fastening structure or adhesive is utilized to bind the individual elements 58 to shaft 48. Therefore, magnetic drive 52 comprises a series of magnetic elements 58 of opposite and alternating polarities which extend side-by-side along the spiral to create a generally continuous spiral magnetic drive 52. Small barrier strips 68 of shaft metal separate the individual elements.

Similarly, magnetic thread segments 34 of carrier base 36 are preferably made up of a plurality of magnetic elements 67 which are situated on base 36 so that their outer sides which face the magnetic drive 52 have alternating opposite magnetic polarities. Referring to FIG. 5, thread segment element 72 is polarized magnetically south at its outer end and north at its inner end while adjacent elements 70 and 74 are polarized magnetically south at their outer ends and north at their inner ends. The elements 67 are situated on base 36 to form a series of parallel and generally continuous linear thread segments. The magnetic elements 58 of drive 52 are magnetically attracted to the elements 67 of the thread segments 34 which have an opposite magnetic polarity at their outer ends. The opposing polarities of the magnetic elements 58 of drive 52 and elements 67 of thread segments 34 magnetically couple base 36 of carrier 24 to shaft 48 so that when shaft 48 rotates, carrier 24 moves in a linear direction along the shaft 48. The thread segments 34 are disposed on base 36 to extend generally parallel to the adjacent drive sections of spiral magnetic drive 52.

Figures 7, 8:
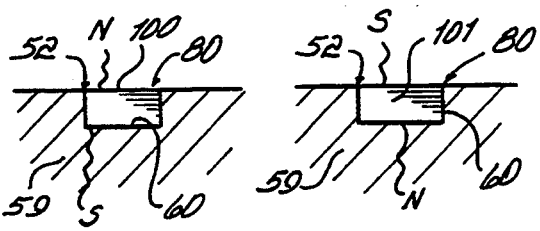
FIG. 7 is a cross-sectional view along lines 7—7 of FIG. 6.
FIG. 8 is a cross-sectional view along lines 8—8 of FIG. 6.

FIGS. 6, 7, and 8 illustrate how the spiral magnetic drive of the present invention is formed. Steel shaft 59 has at least one groove formed therein, such as groove 60, which winds spirally around the shaft 59. For purposes of illustration, groove 60 is chosen, although additional grooves may be formed in shaft 59 in accordance with an alternative embodiment of the present invention as described hereinbelow. As seen in FIG. 7, a magnetic element 100 is seated within groove 60 so that the south polarized side rests in the bottom of groove 60 and the north polarized side faces outwardly from the groove to form magnetic drive 52. The magnetic attraction between the magnetic element 100 and the steel shaft keeps the element 100 seated in groove 60. The adjacent drive element 101 is seated in groove 60 so that the north polarized side of the element faces the bottom of the groove (See FIG. 8). In this way, magnetic elements having alternating polarities on their outer extremities collectively form the spiral magnetic drive 52. Similarly to element 100, the individual elements remain seated in groove 60 due to magnetic attraction between the elements and steel shaft 59.

FIG. 5 illustrates in a more detailed way how the spiral drive 52 of shaft 48 engages the thread segments 34 of carrier 24 and how the carrier 24 moves linearly as the shaft 48 rotates. FIG. 5 shows carrier base 36 partially cut away and in phantom overlying shaft 48. The thread segments 34 of FIG. 5 are shown offset slightly from the angled drive sections of drive 52 to illustrate the interaction between the drive 52 and the thread segments 34. In reality, the thread segments 34 are strongly magnetically coupled to drive 52 and will usually directly overlie drive 52 due to the magnetic attraction. Drive elements 64, 65, and 66 are magnetically polarized south, north and south, respectively. The magnetic elements 70, 72, and 74 of thread segment 34a are magnetically polarized north, south, north, respectively, and therefore, are attracted to drive elements 64, 65, and 66 of spiral drive 52. When shaft 48 rotates around axle 49 in a counter-clockwise or left-hand direction as indicated by arrow 76, the elements 64, 65, and 66 of drive 52 move to the left of FIG. 5. As the shaft 48 rotates, a new set of drive elements such as element 69 and other successive elements (not shown) polarized south, north and south, respectively, like drive elements 64, 65, and 66, move into proximity with thread segment 34 and elements 70, 72, and 74. Because drive elements 69 and the successive other drive elements (not shown) are of an opposite magnetic polarity to elements 70, 72, and 74, they are also attracted to the thread segment elements. However, as may be seen, drive elements 69 and the successive other elements are located further along the drive 52 and further along shaft 48 in a direction designated by arrow 77 and a distance designated D. As the shaft 48 rotates, a new successive section of drive 52 faces the thread segments, and the new set of drive elements, such as element 69 of the section travel to face the lower non-magnetic wall 38b of housing 12b (see FIG. 2) and to face thread segment 34a including elements 70, 72, and 74. Various opposing and attracting magnetic forces act upon thread segment 34a as drive 52 rotates. These magnetic forces, created by oppositely polarized drive elements and thread segment elements repelling and attracting each other, cause base 36 and wafer carrier 24 to try to move side-to-side and linearly along the shaft 48. For example, as shaft 48 rotates, north polarized drive element 69 must pass over like polarized thread segment element 74 so that it can magnetically couple with thread segment element 72, and therefore, element 69 will repel element 74. The wafer carrier 24 cannot move from side-to-side due to its connection to and confinement by tracks 14. The combination of magnetic forces instead moves the carrier 24 linearly in the direction of arrow 77 along the shaft 48. The magnetic attraction between the spiral magnetic drive 52 and the thread segments 34 is of such strength and the drive and thread segments are coupled as such that the wafer carrier will move smoothly forward or backward as the shaft rotates and successively new sections of magnetic drive 52 are exposed to thread segments elements 70, 72, and 74.

While the elements of drive 52 of a certain magnetic polarization are shown in FIG. 5 in longitudinal alignment along shaft 48 with other similarly polarized elements in adjacent drive sections, other embodiments of the present invention might utilize element spacing that does not produce such a result. For example, drive element 65 is shown in alignment with element 71; however, the spacing may be such on shaft 48 that this alignment does not occur and element 66 might longitudinally align with oppositely polarized element 73. In this way, some elements of the drive and thread segments may be attracted to each other while other elements simultaneously repel each other. Regardless, the net effect is attraction and translation of the wafer carrier by the drive.

While FIG. 5 shows the interaction of one thread segment 34 and a single section of spiral drive 52, it will be appreciated that a plurality of thread segments on base 36 of carrier 24 interact with the other exposed sections of drive 52 when the carrier 24 and rotating shaft 48 are coupled together to translate carrier 24 in a linear direction. By increasing the windings on spiral drive 52 within the length of shaft 48, i.e., decreasing the lead angle of the drive 52, the linear distance moved by the carrier 24 with each rotation of shaft 48 decreases. This results in a smoother translation of the carrier. Further, having a thread segment 34 for each exposed section of drive 52 also promotes smoother translation of carrier.

While the embodiments of the shaft shown in FIGS. 1-5 utilize a single magnetic drive 52, a plurality of drives as shown in FIG. 6 might also be used. Shaft 59 of FIG. 6 shows four grooves 60, 61, 62 and 63 which are cut in shaft 59 to hold a magnetic drive, such as drive 80. The additional grooves 60, 61, 62 and 63 wrap around shaft 59 and preferably originate at equidistant points 81a–d around the periphery 82 of the end 84 of shaft 59. By originating the grooves at equidistant points 81a–d around the periphery 82 and winding the spiral grooves with the same lead angle φ, the distance d between each groove and corresponding magnetic drive will be equal. Depending upon the width of the spiral drives, like drive 80, a varying number of spiral drives may be utilized on shaft 59 to further increase the smoothness of the linear motion of the carrier 24 through the housings 12. The drives may also be wrapped around the shaft 59 originating at points around the periphery that are not equidistant.

Since the spiral magnetic linear translating mechanism 46 of the present invention uses no intermeshed gears or frictional couplings or connections, wafer carriers 24 are linearly translated in an environment which is, for all practical purposes, particulate free. While there is some mechanical contact between the carrier wheels 40 and the C-shaped channels 42 of track 14, the wheels are substantially surrounded by the channels 42 and are located below the wafer holding pallet 26. Finally, because the wafers 27 are mounted to pallet 26 in vertical orientation, the possibility of any particulate settling on wafers during processing is further minimized.

While these and other features of the spiral magnetic linear translating system of the present invention have been described in accordance with a preferred embodiment of the invention, it is to be understood that the invention is not limited thereby and in light of the present disclosure, various other alternative embodiments will be apparent to one of ordinary skill in the art without departing from the scope of the invention. For example, the number of magnetic drives 52 may be increased along with the number of thread segments 34 on base 36 without departing from the scope of the invention. Furthermore, a single shaft 48 with magnetic drive 52 may extend the entire length of the processing line. Still further, various different magnetic coupling alternatives might be utilized to couple the thread segments to the spiral drive, such as by making all of the thread segments of one effective magnetic polarity and making the spiral drive of the opposite magnetic polarity. Accordingly, applicant intends to be bound only by the following claims.

We claim:

1. A magnetic translating mechanism to move a wafer along a path through a wafer processing chamber having at least one wall comprising:

an elongated cylindrical shaft located externally of the processing chamber and mounted to extend parallel to said path, the shaft rotating on its longitudinal axis adjacent a wall of the processing chamber;

at least one elongated magnetic drive, comprising successive drive sections, wound spirally around the shaft to rotate with the shaft; and a wafer support structure for holding a wafer, said support structure mounted to be movable within the chamber proximate the wall so as to move generally along said path parallel to the axis of the elongated shaft, the structure having at least one magnetic thread segment thereon to magnetically couple the structure to a section of the magnetic drive, rotation of the shaft exposing the thread segment to different successive sections of the drive disposed further along the length of the shaft, such that the thread segment is coupled to the successive drive sections and moves the structure linearly along said path parallel to the elongated shaft as the shaft rotates.

2. The magnetic translating mechanism of claim 1 wherein the spiral magnetic drive is wound to extend along substantially the entire length of the shaft.

3. The magnetic translating mechanism of claim 1 wherein the support structure thread segment extends in a direction substantially parallel to the section of the spiral magnetic drive to which it is coupled.

4. The magnetic translating mechanism of claim 1, the spiral magnetic drive comprising a plurality of magnetic elements disposed generally side-by-side on the shaft to collectively form a generally continuous spiral magnetic drive.

5. The magnetic translating mechanism of claim 4 wherein each successive magnetic drive element has an opposite magnetic polarity at its outer extremity to its adjacent magnetic drive elements.

6. The magnetic translating mechanism of claim 4, the support structure magnetic thread segment comprising a plurality of magnetic elements disposed generally side-by-side to form a generally continuous magnetic thread segment.

7. The magnetic translating mechanism of claim 6 wherein each successive magnetic thread segment element has an opposite magnetic polarity at its outer extremity to its adjacent magnetic thread segment elements.

8. The magnetic translating mechanism of claim 6 wherein at least one thread segment element is magnetically attracted to a magnetic drive element of the opposite polarity to magnetically couple the support structure to the drive, the rotation of the shaft exposing the thread segment element to different successive magnetic drive elements of the opposite polarity which are disposed further along the length of the magnetic drive, such that the thread segment element is magnetically coupled to a different successive drive element as the shaft rotates causing the wafer support structure to move linearly parallel to the shaft as the shaft rotates.

9. The magnetic translation mechanism of claim 4 wherein the shaft is made of a ferromagnetic material and includes at least one spiral-shaped groove therein, the magnetic elements adhering to the shaft by magnetic attraction inside the groove to collectively form the spiral magnetic drive.

10. The magnetic wafer support mechanism of claim 1 wherein the translating structure includes a plurality of magnetic thread segments spaced from each other along the length of the structure, and at least two thread segments of the plurality are magnetically coupled to the spiral magnetic drive at the same time to more smoothly move the wafer support structure linearly through the processing chamber.

11. The magnetic translating mechanism of claim 10 wherein each thread segment of the plurality is coupled to the spiral magnetic drive.

12. The magnetic translating mechanism of claim 1 further comprising a sleeve made of a non-magnetic material which is disposed over the shaft and spiral magnetic drive to protect the magnetic drive.

13. The magnetic translating mechanism of claim 1 wherein the elongated magnetic drive is wound spirally around the shaft to maintain a generally uniform lead angle along the length of the shaft.

14. The magnetic translating mechanism of claim 13 further comprising a plurality of thread segments, the thread segments disposed on the wafer support structure essentially equidistant from one another along the length of the structure and angled from the longitudinal axis of the shaft to be generally parallel with each other, to align with the angled sections of the spiral drive which face the thread segments to more strongly couple the thread segments to the drive.

15. The magnetic translating mechanism of claim 1 further comprising a plurality of elongated magnetic drives, each originating at a point spaced around the periphery of one end of the shaft, the drives wound spirally around the shaft to interleave with one another and maintain approximately the same lead angle so that adjacent drive sections do not intersect one another.

16. The magnetic translating mechanism of claim 15, wherein the peripheral origination points of the plurality of spiral magnetic drives are spaced equidistant around the periphery of at least one end of the cylindrical shaft.

17. The magnetic translating mechanism of claim 15 wherein the support structure includes a plurality of magnetic thread segments and at least two thread segments of the plurality are magnetically coupled to the spiral magnetic drives.

18. The magnetic translating mechanism of claim 17 wherein each thread segment of the plurality of thread segments is magnetically coupled to a section of a spiral magnetic drive on the shaft.

19. A magnetic transmitting mechanism to move a wafer along a path through a wafer processing chamber having at least one wall comprising:
   a wafer support for supporting a wafer, the support mounted to be movable along the path within a processing chamber;
   a magnetic coupling device disposed on the support proximate one side of the chamber wall;
   a rotatable magnetic driver mounted externally of the chamber and including successive magnetic drive sections, each successive drive section located further along the path than the preceding drive section, the driver disposed proximate the other side of the chamber wall to impose magnetic fields within the chamber and magnetically coupled to the magnetic coupling device such that when the driver rotates it exposes different successive drive sections located further along the path to the magnetic coupling device and drives the coupling device and the wafer support along the path through the chamber.

20. The magnetic translating mechanism of claim 19 wherein the magnetic driver includes an elongated cylindrical shaft mounted to extend parallel to the path and to rotate on a longitudinal axis adjacent the other side of the chamber wall, and further includes at least one elongated magnetic drive comprising successive drive sections wound spirally around the shaft to rotate with the shaft such that rotation of the shaft exposes the magnetic coupling device to different successive sections of the magnetic drive disposed further along the length of the shaft such that the coupling device is coupled to the successive drive sections to drive the coupling device and the wafer support linearly along the path parallel to the elongated shaft.

21. The magnetic translating mechanism of claim 19 wherein the magnetic coupling device comprises a plurality of magnetic coupling elements disposed generally side-by-side, each coupling element having an opposite magnetic polarity at its outer extremity to its adjacent coupling elements; and
   the magnetic driver comprises a plurality of magnetic drive elements disposed generally side-by-side, each drive element having an opposite magnetic polarity at its outer extremity to its adjacent drive elements;
   at least one coupling element being magnetically attracted to a drive element of the opposite polarity to magnetically couple the magnetic coupling device to the magnetic driver.

22. A wafer processing line comprising:
   a plurality of serially-connected housings;
   processing means coupled to at least one of the housings to perform a processing step in the housing;
   a wafer support structure to receive a wafer;
   guide means for guiding the wafer support structure along a path through the serial housings; and
   a magnetic translating mechanism to move the support structure along the path through a housing comprising:
     an elongated cylindrical shaft located externally of at least one of the housings and mounted to extend generally parallel with the path, the shaft rotating on its longitudinal axis adjacent a first wall of the housing;
     at least one elongated magnetic drive, comprising successive drive sections, wound spirally around the shaft to rotate with the shaft, the drive imposing magnetic fields inside the housing proximate the first wall;
     at least one magnetic thread segment disposed on the support structure to face the first wall when the structure is in the housing, the thread segment magnetically coupling the support structure to a section of the magnetic drive proximate the first wall, rotation of the shaft exposing the thread segment to different successive sections of the drive which are disposed further along the length of the shaft, such that the thread segment is coupled to the successive drive sections and moves the structure linearly along said path, through the housings, as the shaft rotates.

23. The wafer processing line of claim 22, the spiral magnetic drive comprising a plurality of magnetic elements disposed generally side-by-side on the shaft to collectively form a generally continuous spiral magnetic drive, each successive magnetic drive element having an opposite magnetic plurality at its outer extremity to its adjacent magnetic drive elements.

24. The wafer processing line of claim 23, wherein the support structure magnetic thread segment comprises a plurality of magnetic elements disposed generally side-by-side to form a generally continuous magnetic thread segment, each successive magnetic thread segment element having an opposite magnetic plurality at its outer extremity to its adjacent magnetic thread segment elements, at least one thread segment element magnetically attracted to a magnetic drive element of the opposite plurality to magnetically couple the support structure to the drive, the rotation of the shaft exposing the thread segment element to different successive magnetic drive elements of the opposite polarity which are disposed further along the length of the magnetic drive, such that the thread segment element is magnetically coupled to a different successive drive element as the shaft rotates causing the wafer support structure to move linearly along the path as the shaft rotates.

25. The wafer processing line of claim 22 wherein the support structure includes a plurality of magnetic thread segments spaced from each other along the structure, and at least two thread segments of the plurality are magnetically coupled to the spiral magnetic drive at the same time to more smoothly move the wafer support structure linearly through the housings.

26. The wafer processing line of claim 22 further comprising a plurality of elongated magnetic drives, each drive originating at a point spaced around the periphery of one end of the shaft, the drives wound spirally around the shaft to interleave with one another and maintain approximately the same lead angle so that adjacent drive sections do not intersect one another.

27. The wafer processing line of claim 22 further comprising a complete magnetic translating mechanism associated with each of the serially-connected housings so that a wafer may be moved through each of the housings.

28. The wafer processing line of claim 27, the wafer support structure having a plurality of thread segments and dimensioned to extend between adjacent serial housings, so that a thread segment on the forward end of the support structure is coupled to the magnetic drive of one housing and a thread segment at the rearward end of the structure is coupled to the drive of the previous housing in order to continuously move the structure from housing to housing along the processing line.

29. The wafer processing line of claim 22 wherein one elongated cylindrical shaft with successive drive sections extends adjacent at least two of the serially-connected housings, whereby the wafer support structure is magnetically coupled to the same shaft as it moves through the two serially-connected housings.

30. A method of transporting wafers along a path through a wafer processing chamber having a wall comprising the steps of:
  a.) supporting a wafer in a support structure which is movable along the path within the processing chamber proximate a chamber wall, the structure including at least one magnetic thread segment disposed thereon facing the wall;
  b.) positioning the support structure so that the thread segment is opposite an elongated cylindrical shaft mounted externally of the chamber proximate the wall to rotate on an axis which extends generally parallel to the path, the shaft including an elongated magnetic drive comprising successive sections wound spirally around the shaft to rotate with the shaft so that sections of the drive face the wall opposite the magnetic thread segment of the translating structure, the drive section imposing magnetic fields within the chamber in proximity to the thread segment so that the thread segment magnetically couples to a drive section;
  c.) rotating the shaft so that the thread segment is opposite and coupled to a different successive section of the spiral drive, which is disposed further along the length of the shaft such that the structure moves linearly along the shaft and along the path through the chamber when the shaft rotates;
  whereby the rotating spiral drive translates the wafer translating structure through the processing chamber with reduced friction and reduced particulate generation in the chamber.

31. The method of claim 30, the spiral drive comprising a plurality of successive magnetic elements disposed generally side-by-side on the shaft to collectively form a generally continuous spiral magnetic drive.

32. The method of claim 31 wherein each successive magnetic drive element has an opposite magnetic polarity at its outer extremity to its adjacent magnetic drive elements.

33. The method of claim 30, wherein the thread segment provides a plurality of magnetic elements disposed generally side-by-side on the wafer support structure to form a generally continuous magnetic thread segment, each magnetic thread segment element having an opposite magnetic polarity at its outer extremity to its adjacent magnetic thread segment elements, the method further comprising the step of exposing at least one thread segment element to successive magnetic drive elements of the opposite polarity located further along the shaft by rotating the shaft so that the magnetic coupling between the thread segment elements and the successive drive elements moves the support structure along the path.

34. The method of claim 30 wherein the wafer support structure includes a plurality of magnetic thread segments and at least two thread segments are magnetically coupled to the spiral magnetic drive to more smoothly move the wafer support structure linearly along the path through the processing chamber.

35. The method of claim 30 wherein a non-magnetic sleeve is placed over the shaft and spiral magnetic drive to protect the magnetic drive from damage.

36. The method of claim 30 wherein the shaft further includes a plurality of elongated magnetic drives, the drives wound spirally to interleave with one another and maintain approximately the same lead angle so that adjacent drives do not intersect one another.

37. A method of transporting wafers along a path through a wafer processing chamber having a wall comprising the steps of:
  a) supporting a wafer in a support which is moveable along the path through the processing chamber, the support including a magnetic coupling device disposed on the support proximate one side of the chamber wall;
  b) positioning the support in the chamber so that the magnetic coupling device is opposite a magnetic driver mounted externally of the chamber, the driver including successive magnetic drive sections disposed proximate the other side of the chamber wall to impose magnetic fields in the chamber and magnetically couple the driver to the coupling device;
  c) exposing different successive magnetic drive sections to the coupling device so that the coupling device magnetically couples to the successive drive sections, the successive sections located further along the path to move the support along the path through the wafer processing chamber.

* * * * *

UNITED STATES PATENT AND TRADEMARK OFFICE
CERTIFICATE OF CORRECTION

PATENT NO. : 5,377,816
DATED : January 3, 1995
INVENTOR(S) : Deligi et al.

It is certified that error appears in the above-indentified patent and that said Letters Patent is hereby corrected as shown below:

Col. 4, line 2, "as two as two" ahould be -- as few as two --.

Col. 4, line 61, insert "in" after "stretch".

Col. 6, line 63, "frown" should be -- from --.

Col. 7, line 65, "shalt" should be -- shaft --.

Col. 10, line 50, "element 65" should be -- element 66 --.

Col. 12, line 61, "wafer support" should be deleted and insert therefor -- translating --.

Col. 12, line 62, "translating" should be deleted and insert therefor -- wafer support --.

Signed and Sealed this

Second Day of January, 1996

Attest:

BRUCE LEHMAN

Attesting Officer    Commissioner of Patents and Trademarks